United States Patent
Tseng et al.

(10) Patent No.: US 10,752,744 B2
(45) Date of Patent: Aug. 25, 2020

(54) THERMALLY CONDUCTIVE RESIN, RESIN COMPOSITION, PREPREG, AND COPPER CLAD LAMINATE

(71) Applicants: INDUSTRIAL TECHNOLOGY RESEARCH INSTITUTE, Hsinchu (TW); ITEQ CORPORATION, Xinpu Township, Hsinchu County (TW)

(72) Inventors: Feng-Po Tseng, Taoyuan (TW); Wen-Pin Ting, Kaohsiung (TW); Kuo-Chan Chiou, Tainan (TW)

(73) Assignees: INDUSTRIAL TECHNOLOGY RESEARCH INSTITUTE, Hsinchu (TW); ITEQ CORPORATION, Xinpu Township (TW)

( * ) Notice: Subject to any disclaimer, the term of this patent is extended or adjusted under 35 U.S.C. 154(b) by 393 days.

(21) Appl. No.: 15/856,514

(22) Filed: Dec. 28, 2017

(65) Prior Publication Data
US 2019/0194408 A1 Jun. 27, 2019

(30) Foreign Application Priority Data
Dec. 25, 2017 (TW) .............................. 106145518 A

(51) Int. Cl.
| | |
|---|---|
| C08J 5/24 | (2006.01) |
| C08G 61/10 | (2006.01) |
| C08K 5/25 | (2006.01) |
| C08K 5/14 | (2006.01) |
| C08K 5/17 | (2006.01) |
| C08K 5/23 | (2006.01) |
| B32B 33/00 | (2006.01) |
| C08F 212/34 | (2006.01) |
| C09D 4/00 | (2006.01) |
| C08F 220/20 | (2006.01) |
| C08L 29/10 | (2006.01) |
| C08K 5/00 | (2006.01) |
| C08K 5/5415 | (2006.01) |
| H05K 1/05 | (2006.01) |
| C08K 5/3492 | (2006.01) |

(52) U.S. Cl.
CPC ................ *C08J 5/24* (2013.01); *B32B 33/00* (2013.01); *C08F 212/34* (2013.01); *C08F 220/20* (2013.01); *C08G 61/10* (2013.01); *C08K 5/0025* (2013.01); *C08K 5/14* (2013.01); *C08K 5/17* (2013.01); *C08K 5/23* (2013.01); *C08K 5/3492* (2013.01); *C08K 5/5415* (2013.01); *C08L 29/10* (2013.01); *C09D 4/00* (2013.01); *H05K 1/056* (2013.01); *B32B 2260/044* (2013.01); *B32B 2307/302* (2013.01); *B32B 2311/12* (2013.01); *C08J 2347/00* (2013.01)

(58) Field of Classification Search
CPC ...... C08J 5/24; B32B 33/00; B32B 2260/044; B32B 2307/302; B32B 2311/12; B32B 2347/00; C08F 212/34; C08F 220/20; C08G 61/10; C08K 5/0025; C08K 5/14; C08K 5/17; C08K 5/23; C08K 5/3492; C08K 5/5415; C08L 29/10; C09D 4/00; H05K 1/056

USPC ........................................................ 428/461
See application file for complete search history.

(56) References Cited

U.S. PATENT DOCUMENTS

| | | | |
|---|---|---|---|
| 6,646,102 B2 | 11/2003 | Boriack et al. | |
| 6,835,785 B2 | 12/2004 | Ishii et al. | |
| 7,049,388 B2 | 5/2006 | Boriack et al. | |
| 7,109,288 B2 | 9/2006 | Akatsuka et al. | |
| 7,662,307 B2 | 2/2010 | Chiou et al. | |
| 8,530,566 B2 | 9/2013 | Lin et al. | |
| 9,371,233 B2 | 6/2016 | Lin et al. | |
| 2006/0074149 A1 | 4/2006 | Boriack et al. | |
| 2011/0073798 A1 | 3/2011 | Yeh et al. | |
| 2017/0145247 A1 | 5/2017 | Ho et al. | |
| 2017/0158932 A1 | 6/2017 | Liu et al. | |

FOREIGN PATENT DOCUMENTS

| | | |
|---|---|---|
| CN | 102675824 A | 9/2012 |
| CN | 101885812 B | 9/2013 |
| CN | 105399946 A | 3/2016 |
| CN | 103842397 B | 4/2017 |
| JP | 5-224187 A * | 9/1993 |

(Continued)

OTHER PUBLICATIONS

Taiwanese Office Action for Appl. No. 106145518 dated Feb. 9, 2018.

*Primary Examiner* — William K Cheung
(74) *Attorney, Agent, or Firm* — Birch, Stewart, Kolasch & Birch, LLP

(57) ABSTRACT

A resin composition is provided, which includes 1 part by weight of a thermally conductive resin, 0.001 to 0.05 parts by weight of radical initiator, and 0.05 to 0.30 parts by weight of crosslinking agent. The chemical structure of the thermally conductive resin is

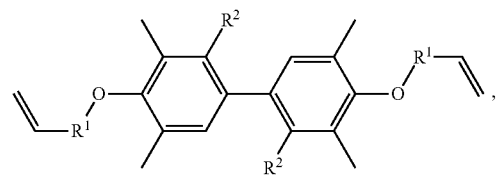

in which $R^1$ is $-CH_2-$, $-C(=O)-$, or $-(CH_2)-(C_6H_5)-$, and $R^2$ is H or $CH_3$.

9 Claims, No Drawings

(56) References Cited

FOREIGN PATENT DOCUMENTS

| | | |
|---|---|---|
| JP | 5395155 B2 | 1/2014 |
| JP | 2014-34580 A | 2/2014 |
| TW | I290565 B | 12/2007 |
| TW | I291480 B | 12/2007 |
| TW | I339424 B1 | 3/2011 |
| TW | I475103 B | 3/2015 |
| TW | I475387 B | 3/2015 |
| WO | WO 2016/014629 A1 | 1/2016 |

* cited by examiner

THERMALLY CONDUCTIVE RESIN, RESIN COMPOSITION, PREPREG, AND COPPER CLAD LAMINATE

CROSS REFERENCE TO RELATED APPLICATIONS

The present application is based on, and claims priority from, Taiwan Application Serial Number 106145518, filed on Dec. 25, 2017, the disclosure of which is hereby incorporated by reference herein in its entirety.

TECHNICAL FIELD

The technical field relates to a resin composition, and more particular, to a thermally conductive resin of the resin composition.

BACKGROUND

Circuit boards and the IC substrates produced for the optoelectronics and semiconductor industries are trending toward high-speed, high density, intensive, and high integration because of the rise in popularity of the "Cloud", the "Internet", the "Internet of things" concept, enhancement of 4G and 5G communication technologies, and improvement in display technologies. The required properties of circuit boards and the IC substrates of the future are not only low dielectric constant and high insulation, but also low dielectric loss and high thermal conductivity.

For example, the simple structure of the copper clad laminate in a circuit board from top to bottom is copper foil, dielectric layer, and copper foil, respectively. However, the middle dielectric layer is usually composed of a resin, glass fiber cloth, or insulation paper with low thermal conductivity, resulting in poor thermal conductivity of the copper clad laminate. In general, a large amount of thermally conductive powder is often added to the dielectric layer to increase the thermal conductivity of the dielectric layer. However, the resin between the thermally conductive powder is not thermally conductive, such that the thermally conductive effect of the thermally conductive powder dispersed in the resin is limited.

A novel thermally conductive resin is called for to overcome the above issue and to increase the thermal conductivity of the dielectric layer between the copper foils.

SUMMARY

One embodiment of the disclosure provides a thermally conductive resin, having a chemical structure of:

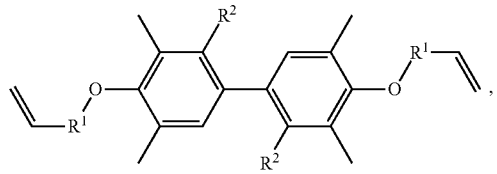

in which $R^1$ is —CH$_2$—, —C(=O)—, or —(CH$_2$)—(C$_6$H$_4$)—, and $R^2$ is H or CH$_3$.

Another embodiment of the disclosure provides a resin composition, comprising: 1 part by weight of a thermally conductive resin, 0.001 to 0.05 parts by weight of radical initiator, and 0.05 to 0.30 parts by weight of crosslinking agent, in which the thermally conductive resin has a chemical structure of:

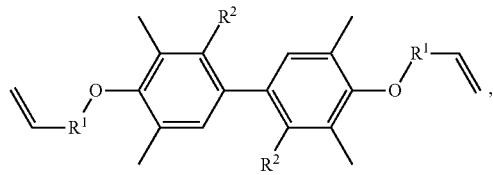

in which $R^1$ is —CH$_2$—, —C(=O)—, or —(CH$_2$)—(C$_6$H$_4$)—, and $R^2$ is H or CH$_3$.

Still another embodiment of the disclosure provides a prepreg, being formed by curing a precursor to B-stage, in which the precursor is formed by impregnating a reinforcing material into the above-mentioned resin composition.

The other embodiment of the disclosure provides a copper clad laminate, being formed by laminating the above-mentioned prepreg and then compressed with the copper foil.

A detailed description is given in the following embodiments.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details.

One embodiment of the disclosure provides a thermally conductive resin, having a chemical structure of:

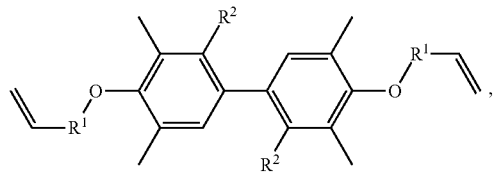

in which $R^1$ is —CH$_2$—, —C(=O)—, or —(CH$_2$)—(C$_6$H$_4$)—, and $R^2$ is H or CH$_3$.

Another embodiment of the disclosure provides a resin composition, including 1 part by weight of the thermally conductive resin, 0.001 to 0.05 parts by weight of radical initiator, and 0.05 to 0.30 parts by weight of crosslinking agent.

In one embodiment, the radical initiator can be a photo initiator, a thermal initiator, or a combination thereof. For example, the radical initiator can be azodiisobutyrodinitrile (AIBN), 2,5-bis(tert-butylperoxy)-2,5-dimethylhexane, dicumyl peroxide (DCPO), benzoyl peroxide, 2,2-bis(tert-butylperoxy)butane, 2,5-dimethyl-2,5-di(tert-butylperoxy) hex-3-yne, 1,1-bis(tert-butylperoxy) cyclohexane, 1,1-bis (tert-butylperoxy)-3,3,5-trimethylcyclohexane, tert-butyl hydroperoxide, di-tert-butyl peroxide, tert-butyl peroxybenzoate, or a combination thereof. If the proportion of the radical initiator is too high, the molecular weight of the crosslinked resin composition will be too low, resulting in poor physical properties of the crosslinked resin composition. On the other hand, if the proportion of the radical initiator is too low, it may result in the reaction rate of the resin composition being too slow, which is not beneficial in the applications of further processes.

In one embodiment, the crosslinking agent can be triallyl isocyanurate (TAIC), triallyl cyanurate (TAC), octavinyl octasilasesquioxane, trivinyl amine, or a combination thereof. If the proportion of the crosslinking agent is too high, it may lower the thermal conductivity (e.g. lower the coefficient of thermal conductivity (K)) of the crosslinked resin composition. On the contrary, if the proportion of the crosslinking agent is too low, it may result in poor thermal properties (e.g. lower the glass transition temperature (Tg)) of the crosslinked resin composition.

In one embodiment, the thermally conductive resin of the resin composition has a chemical structure of

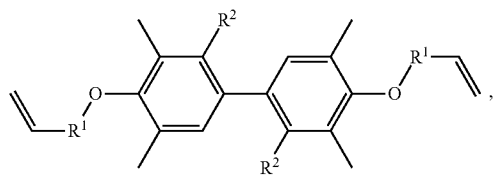

in which $R^1$ is —$CH_2$—, —$C(=O)$—, or —$(CH_2)$—$(C_6H_4)$—, and $R^2$ is H or $CH_3$. In another embodiment, the thermally conductive resin is a combination of

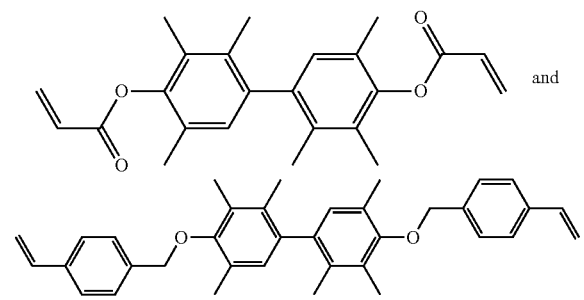

with a weight ratio of 1:3 to 3:1.

In one embodiment, the resin composition may further include another additive such as thermally conductive powder, surfactant, defoamer, leveling agent, pigment, or a combination thereof. Addition of the above-mentioned additive is utilized to adjust the properties or appearance of the crosslinked resin composition.

In one embodiment, the resin composition can be directly coated and then cured to form a film. Alternatively, a reinforcing material can be impregnated into the resin composition to form a precursor, and then curing the precursor to B-stage (e.g. the resin composition in the precursor) to form a prepreg.

In one embodiment, the reinforcing material may include glass, ceramic, carbon material, resin, or a combination thereof. The reinforcing material may have a manner of fiber, powder, flake, fabric, or a combination thereof. For example, the reinforcing material can be a glass fiber cloth.

In one embodiment, the above-mentioned glass fiber cloth can be impregnated into the resin composition (A-stage), and then put into an oven and heated to remove the solvent of the resin composition in the glass fiber cloth and cure the resin composition to form a prepreg (B-stage). The prepreg can be further heated and cured (C-stage) to be provided with the properties such as high thermal conductivity, low dielectric constant, low dielectric loss, and the like.

In one embodiment, the prepreg can be laminated with a copper foil to form a copper clad laminate (CCL). For example, a plurality of prepregs can be interposed between two copper foils to form a stack, and then the stack can be thermally laminated to form the CCL.

As follows, exemplary embodiments will be described in detail so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

Synthesis Example 1

40 g of 4,4'-bi(2,3,6-trimethylphenol) (TMP-BP, commercially available from Mitsubishi Chemical) and 33.9 g of allyl chloride (commercially available from Echo Chemical Co., Ltd.) were added into 40 g of dimethylsulfoxide (DMSO, commercially available from Echo Chemical Co., Ltd.). Next, a small amount of tetra-n-butyl ammonium (commercially available from Echo Chemical Co., Ltd.) and sodium hydroxide (NaOH) were added into the above mixture to perform the subsequent reaction. Then, heating was performed and the reaction was carried out at 80° C. for 3 hours. After the reaction was completed, the reaction temperature was cooled to room temperature, and then the reacted mixture was filtered and purified to obtain a product. The above reaction is shown below.

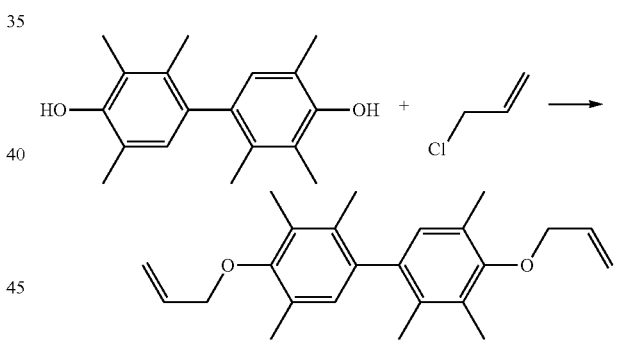

The hydrogen spectrum of the product is shown below: $^1$H NMR (500 MHz, CDCl$_3$): δ6.69 (s, 2H), 6.12~6.04 (m, 2H), 5.39 (d, J=17.5 Hz, 2H), 5.20 (d, J=10.5 Hz, 2H), 4.25 (d, J=5.5 Hz, 4H), 2.18 (s, 6H), 2.16 (s, 6H), 1.83 (s, 6H).

Synthesis Example 2

40 g of TMP-BP and 40.22 g of acryloyl chloride (commercially available from Echo Chemical Co., Ltd.) were added into 100 g of tetrahydrofuran (THF). Next, a small amount of triethylamine (commercially available from Echo Chemical Co., Ltd.) and sodium hydroxide were added into the above mixture to perform the subsequent reaction. Then, cooling was performed and the reaction was carried out at below −30° C. Afterwards, continuous stirring was performed until the temperature reached room temperature. After the reaction was completed, the reacted mixture was filtered and purified to obtain a product. The above reaction is shown below.

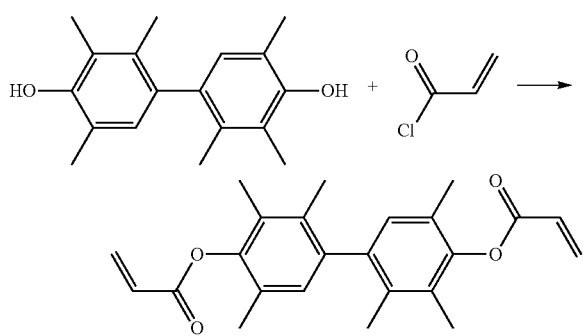

The hydrogen spectrum of the product is shown below:
$^1$H NMR (500 MHz, CDCl$_3$): δ6.85 (s, 2H), 6.66 (d, J=17.5 Hz, 2H), 6.40 (dd, J=17.5 Hz, J=10.5 Hz, 2H), 6.05 (d, J=10.5 Hz, 2H), 2.12 (s, 6H), 2.10 (s, 6H), 1.94 (s, 6H).

Synthesis Example 3

40 g of TMP-BP and 67.83 g of 4-vinylbenzyl chloride (commercially available from Echo Chemical Co., Ltd.) were added into 200 g of methyl ethyl ketone (MEK). Next, a small amount of tetra-n-butylammonium and potassium carbonate were added into the above mixture to perform the subsequent reaction. Then, heating was performed and the reaction was carried out at 90° C. for about 4 hours. After the reaction was completed, the reaction temperature was cooled to room temperature, and then the reacted mixture was filtered and purified to obtain a product. The above reaction is shown below.

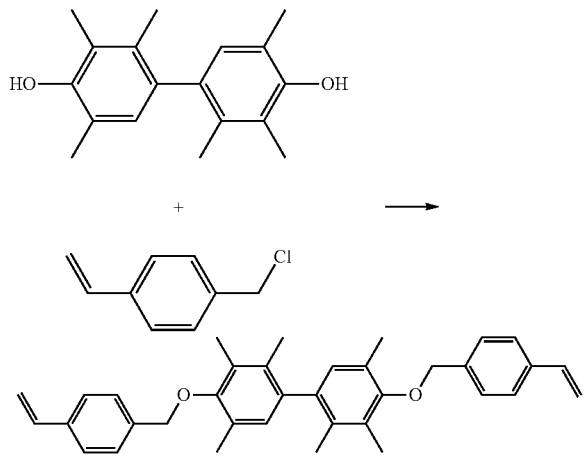

The hydrogen spectrum of the product is shown below:
$^1$H NMR (500 MHz, CDCl$_3$): δ7.49~7.45 (m, 8H), 6.81 (s, 2H), 6.75 (dd, J=17.5 Hz, J=17.5 Hz, 2H), 5.78 (d, J=17.5 Hz, 2H), 5.27 (d, J=11 Hz, 2H), 4.83 (s, 4H), 2.30 (s, 6H), 2.28 (s, 6H), 1.94 (s, 6H).

Example 1

18 g of the product in Synthesis Example 1 serving as a thermally conductive resin, 2 g of crosslinking agent triallyl isocyanurate (TAIC), and 0.02 g of radical initiator azodi-isobutyrodinitrile (AIBN) were added into 10 g of DMSO to be evenly mixed to form a resin composition. The resin composition was coated onto a copper foil and then baked at 210° C. to form a coating. The properties of the coating are shown in Table 1.

Example 2

16 g of the product in Synthesis Example 1 serving as a thermally conductive resin, 4 g of crosslinking agent TAIC, and 0.02 g of radical initiator AIBN were added into 10 g of DMSO to be evenly mixed to form a resin composition. The resin composition was coated onto a copper foil and then baked at 210° C. to form a coating. The properties of the coating are shown in Table 1.

Example 3

18 g of the product in Synthesis Example 2 serving as a thermally conductive resin, 2 g of crosslinking agent TAIC, and 0.02 g of radical initiator AIBN were added into 10 g of DMSO to be evenly mixed to form a resin composition. The resin composition was coated onto a copper foil and then baked at 210° C. to form a coating. The properties of the coating are shown in Table 1.

Example 4

16 g of the product in Synthesis Example 2 serving as a thermally conductive resin, 4 g of crosslinking agent TAIC, and 0.02 g of radical initiator AIBN were added into 10 g of DMSO to be evenly mixed to form a resin composition. The resin composition was coated onto a copper foil and then baked at 210° C. to form a coating. The properties of the coating are shown in Table 1.

Example 5

18 g of the product in Synthesis Example 3 serving as a thermally conductive resin, 2 g of crosslinking agent TAIC, and 0.02 g of radical initiator 101 (2,5-bis(tert-butylperoxy)-2,5-dimethylhexane, commercially available from Echo Chemical Co., Ltd.) were added into 10 g of DMSO to be evenly mixed to form a resin composition. The resin composition was coated onto a copper foil and then baked at 210° C. to form a coating. The properties of the coating are shown in Table 1.

Example 6

16 g of the product in Synthesis Example 3 serving as a thermally conductive resin, 4 g of crosslinking agent TAIC, and 0.02 g of radical initiator 101 were added into 10 g of DMSO to be evenly mixed to form a resin composition. The resin composition was coated onto a copper foil and then baked at 210° C. to form a coating. The properties of the coating are shown in Table 1.

Example 7

12 g of the product in Synthesis Example 2 and 6 g of the product in Synthesis Example 3 serving as a thermally conductive resin, 2 g of crosslinking agent TAIC, and 0.02 g of radical initiator 101 were added into 10 g of DMSO to be evenly mixed to form a resin composition. The resin composition was coated onto a copper foil and then baked at 210° C. to form a coating. The properties of the coating are shown in Table 1.

Example 8

9 g of the product in Synthesis Example 2 and 9 g of the product in Synthesis Example 3 serving as a thermally conductive resin, 2 g of crosslinking agent TAIC, and 0.02 g of radical initiator 101 were added into 10 g of DMSO to be evenly mixed to form a resin composition. The resin composition was coated onto a copper foil and then baked at 210° C. to form a coating. The properties of the coating are shown in Table 1.

Example 9

6 g of the product in Synthesis Example 2 and 12 g of the product in Synthesis Example 3 serving as a thermally conductive resin, 2 g of crosslinking agent TAIC, and 0.02 g of radical initiator 101 were added into 10 g of DMSO to be evenly mixed to form a resin composition. The resin composition was coated onto a copper foil and then baked at 210° C. to form a coating. The properties of the coating are shown in Table 1.

TABLE 1

| | Thermally conductive resin | | | | | | | |
| | Product in Synthesis Example 1 (g) | Product in Synthesis Example 2 (g) | Product in Synthesis Example 3 (g) | TAIC | Radical initiator | Tg (° C.) | K (W/mK) | Dk (10 GHz) | Df (10 GHz) |
| --- | --- | --- | --- | --- | --- | --- | --- | --- | --- |
| Example 1 | 18 | | | 2 | AIBN | 118 | 0.30 | 2.85 | 0.007 |
| Example 2 | 16 | | | 4 | AIBN | 125 | 0.28 | 2.90 | 0.006 |
| Example 3 | | 18 | | 2 | AIBN | 130 | 0.30 | 2.98 | 0.008 |
| Example 4 | | 16 | | 4 | AIBN | 140 | 0.28 | 3.01 | 0.008 |
| Example 5 | | | 18 | 2 | 101 | 180 | 0.32 | 2.64 | 0.007 |
| Example 6 | | | 16 | 4 | 101 | 190 | 0.31 | 2.76 | 0.007 |
| Example 7 | | 12 | 6 | 2 | 101 | 163 | 0.30 | 2.91 | 0.008 |
| Example 8 | | 9 | 9 | 2 | 101 | 170 | 0.32 | 2.88 | 0.008 |
| Example 9 | | 6 | 12 | 2 | 101 | 177 | 0.34 | 2.85 | 0.008 |

As shown in Table 1, the coatings formed by thermally curing the combinations of the thermally conductive resins from the Synthesis Examples, the crosslinking agent, and the radical initiator can be provided with high thermal conductivity (K), low dielectric constant (Dk), and low dielectric loss (Df). The coefficient of thermal conductivities (K) of the coatings were measured according to the standard ASTM-D5470, the dielectric constants (Dk) of the coatings were measured according to the standard JIS C2565, and the dielectric loss (Df) of the coatings were measured according to the standard JISC 2565.

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:

1. A thermally conductive resin, having a chemical structure of:

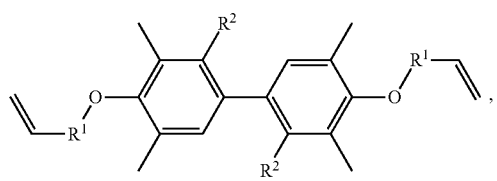

wherein $R^1$ is —$CH_2$—, —C(=O)—, or —$(CH_2)$—$(C_6H_4)$—, and $R^2$ $CH_3$.

2. A resin composition, comprising:
1 part by weight of a thermally conductive resin;
0.001 to 0.05 parts by weight of radical initiator; and
0.05 to 0.30 parts by weight of crosslinking agent,
wherein the thermally conductive resin has a chemical structure of:

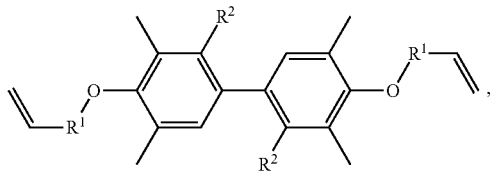

wherein $R^1$ is —$CH_2$—, —C(=O)—, or —$(CH_2)$—$(C_6H_4)$—, and $R^2$ is H or $CH_3$.

3. The resin composition as claimed in claim 2, wherein the thermally conductive resin is a combination of

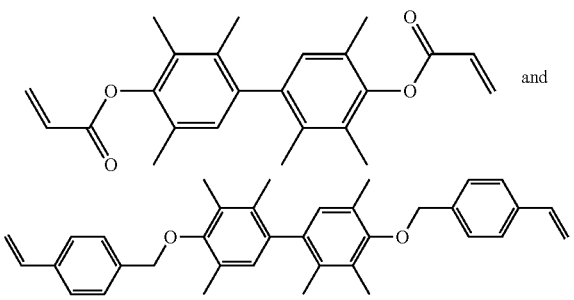

with a weight ratio of 1:3 to 3:1.

4. The resin composition as claimed in claim 2, wherein the crosslinking agent comprises triallyl isocyanurate, triallyl cyanurate, octavinyl octasilasesquioxane, trivinyl amine, or a combination thereof.

5. The resin composition as claimed in claim 2, wherein the radical initiator comprises azodiisobutyrodinitrile, 2,5-bis(tert-butylperoxy)-2,5-dimethylhexane, dicumyl peroxide, benzoyl peroxide, 2,2-bis(tert-butylperoxy)butane, 2,5-dimethyl-2, 5-di(tert-butylperoxy)hex-3 -yne, 1,1-Bis(tert-butylperoxy) cyclohexane, 1,1-bis(tert-butylperoxy)-3,3,5-trimethylcyclohexane, tert-butyl hydroperoxide, di-tert-butyl peroxide, tert-butyl peroxybenzoate, or a combination thereof.

6. A prepreg, being formed by curing a precursor, wherein the precursor is formed by impregnating a reinforcing material into the resin composition as claimed in claim 2.

7. The prepreg as claimed in claim 6, wherein the reinforcing material comprises glass, ceramic, carbon material, resin, or a combination thereof.

8. The prepreg as claimed in claim 6, wherein the reinforcing material has a manner of fiber, powder, flake, fabric, or a combination thereof.

9. A copper clad laminate, comprising:
   the prepreg as claimed in claim 6 laminated to a copper foil.

* * * * *